US008064619B2

(12) United States Patent
Wu

(10) Patent No.: US 8,064,619 B2

(45) Date of Patent: Nov. 22, 2011

(54) MICROPHONE AND INTEGRATED CIRCUIT CAPIBLE OF ECHO CANCELLATION

(75) Inventor: Li-Te Wu, Taipei (TW)

(73) Assignee: Fortemedia, Inc., Cupertino, CA (US)

( * ) Notice: Subject to any disclaimer, the term of this patent is extended or adjusted under 35 U.S.C. 154(b) by 542 days.

(21) Appl. No.: 12/366,744

(22) Filed: Feb. 6, 2009

(65) Prior Publication Data

US 2010/0202634 A1 Aug. 12, 2010

(51) Int. Cl.

| | |
|---|---|
| ***H04R 3/00*** | (2006.01) |
| ***H03F 99/00*** | (2009.01) |
| ***H03B 29/00*** | (2006.01) |
| ***G10K 11/16*** | (2006.01) |

(52) U.S. Cl. ........................ 381/111; 381/71.1; 381/120

(58) Field of Classification Search ................. 381/71.1, 381/111, 120

See application file for complete search history.

(56) References Cited

U.S. PATENT DOCUMENTS

| | | | | |
|---|---|---|---|---|
| 2008/0226094 | A1 * | 9/2008 | Rutschman | 381/79 |
| 2009/0238377 | A1 * | 9/2009 | Ramakrishnan et al. | 381/92 |
| 2009/0274315 | A1 * | 11/2009 | Carnes et al. | 381/66 |
| 2010/0150383 | A1 * | 6/2010 | Sampat | 381/311 |

* cited by examiner

*Primary Examiner* — Luan C Thai

(74) *Attorney, Agent, or Firm* — Thomas|Kayden

(57) ABSTRACT

The invention provides an integrated circuit of a microphone. In one embodiment, the integrated circuit receives a first signal converted from a sound and receives a reference signal with a digital format for echo cancellation. In one embodiment, the integrated circuit comprises a pre-amplifier, an analog-to-digital converter, a digital signal processor, and a post amplifier. The pre-amplifier amplifies the first signal according to a first gain to obtain a third signal. The analog-to-digital converter converts the third signal from analog to digital to obtain a fourth signal. The digital signal processor cancels an echo component from the fourth signal according to the reference signal to obtain a fifth signal, and determines the first gain and a second gain, wherein a product of the first gain and the second gain is kept constant, and the first gain is determined so that an amplitude of the third signal is kept equal to an amplitude of the reference signal. The post-amplifier amplifies the fifth signal according to the second gain to obtain a second signal as an output of the integrated circuit.

20 Claims, 6 Drawing Sheets

MICROPHONE AND INTEGRATED CIRCUIT CAPIBLE OF ECHO CANCELLATION

BACKGROUND OF THE INVENTION

1. Field of the Invention

The invention relates to microphones, and more particularly to echo cancellation for signals generated by microphones.

2. Description of the Related Art

An audio processing device with full-duplex audio processing capability, such as a telephone, processes two signals transmitted in different directions. The audio processing device comprises two channels. One channel transmits a near-end signal comprising near-end voices to a far-end user, and the other channel transmits a far-end signal comprising far-end voices to a near-end user, thus enabling the near-end user and the far-end user to talk to each other.

Referring to FIG. 1, a block diagram of a portion of an audio processing device 100 with full-duplex audio processing capability is shown. The audio processing device 100 comprises a digital-to-analog converter 102, a speaker 104, a microphone 112, an analog-to-digital converter 114, and a digital signal processor 116. For a far-end channel, the digital-to-analog converter 102 first converts a far-end signal $F_1$ from digital to analog to obtain a far-end signal $F_2$. The speaker 104 then broadcasts the far-end signal $F_2$ at the near-end side, enabling a near-end user to hear the far-end voices. For a near-end channel, the microphone 112 first converts a near-end sound comprising near-end voices to a near-end signal $N_1$. The analog-to-digital converter 114 then converts the near-end signal $N_1$ from analog to digital to obtain a near-end signal $N_2$.

When the speaker 104 broadcasts the far-end signal $F_2$, the microphone 112 converts a portion of the far-end voices sounded by the speaker 104 in addition to near-end voices to the near-end signal $N_1$. The near-end signals $N_1$ and $N_2$ therefore comprise far-end voice components referred to as echoes. Thus, before the near-end signal $N_2$ is transmitted to a far-end side, an echo component must be removed from the near-end signal $N_2$. The digital signal processor 116 for echo cancellation comprises an adaptive filter 118 and a subtractor 120. The adaptive filter 118 first filters the far-end signal $F_1$ to obtain a filtered far-end signal $F_3$ comprising echo components. The subtractor 120 then subtracts the filtered far-end signal $F_3$ from the near-end signal $N_2$ to obtain a near-end signal $N_3$ without echo components, thus completing echo cancellation.

The audio processing device 100, however, has deficiencies. First, the digital signal processor 116 for echo cancellation and the analog-to-digital converter 114 are separate elements, thus occupying a relatively larger layout area on a printed circuit board and increasing the size of the audio processing device 100. In addition, the audio processing device 100 cannot adjust a gain of the near-end signal $N_1$. When amplitudes of near-end voices are low, a signal-to-noise ratio of the near-end signal $N_3$ increases, degrading the quality of the near-end signal $N_3$. When amplitudes of far-end voices broadcasted by the speaker 104 are high, the near-end signal $N_1$ comprises an echo component with a high amplitude, thus saturating the analog-to-digital converter 114, and degrading the quality of the near-end signal $N_3$. Thus, a microphone without the aforementioned deficiencies is therefore provided.

BRIEF SUMMARY OF THE INVENTION

The invention provides a microphone. In one embodiment, the microphone comprises a microphone cartridge and an integrated circuit. The microphone cartridge receives a sound and converts the sound to a first signal. The integrated circuit receives a reference signal from a baseband processor, cancels an echo component from the first signal according to the reference signal to obtain a second signal, and outputs the second signal to the baseband processor, wherein the reference signal has a digital format and is sent from a remote side. In addition, the integrated circuit receives the reference signal and outputs the second signal via a data line coupled between the integrated circuit and the baseband processor.

The invention provides an integrated circuit of a microphone. In one embodiment, the integrated circuit receives a first signal converted from a sound and receives a reference signal with a digital format for echo cancellation. In one embodiment, the integrated circuit comprises a pre-amplifier, an analog-to-digital converter, a digital signal processor, and a post amplifier. The pre-amplifier amplifies the first signal according to a first gain to obtain a third signal. The analog-to-digital converter converts the third signal from analog to digital to obtain a fourth signal. The digital signal processor cancels an echo component from the fourth signal according to the reference signal to obtain a fifth signal, and determines the first gain and a second gain, wherein a product of the first gain and the second gain is kept constant, and the first gain is determined so that an amplitude of the third signal is kept equal to an amplitude of the reference signal. The post-amplifier amplifies the fifth signal according to the second gain to obtain a second signal as an output of the integrated circuit.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
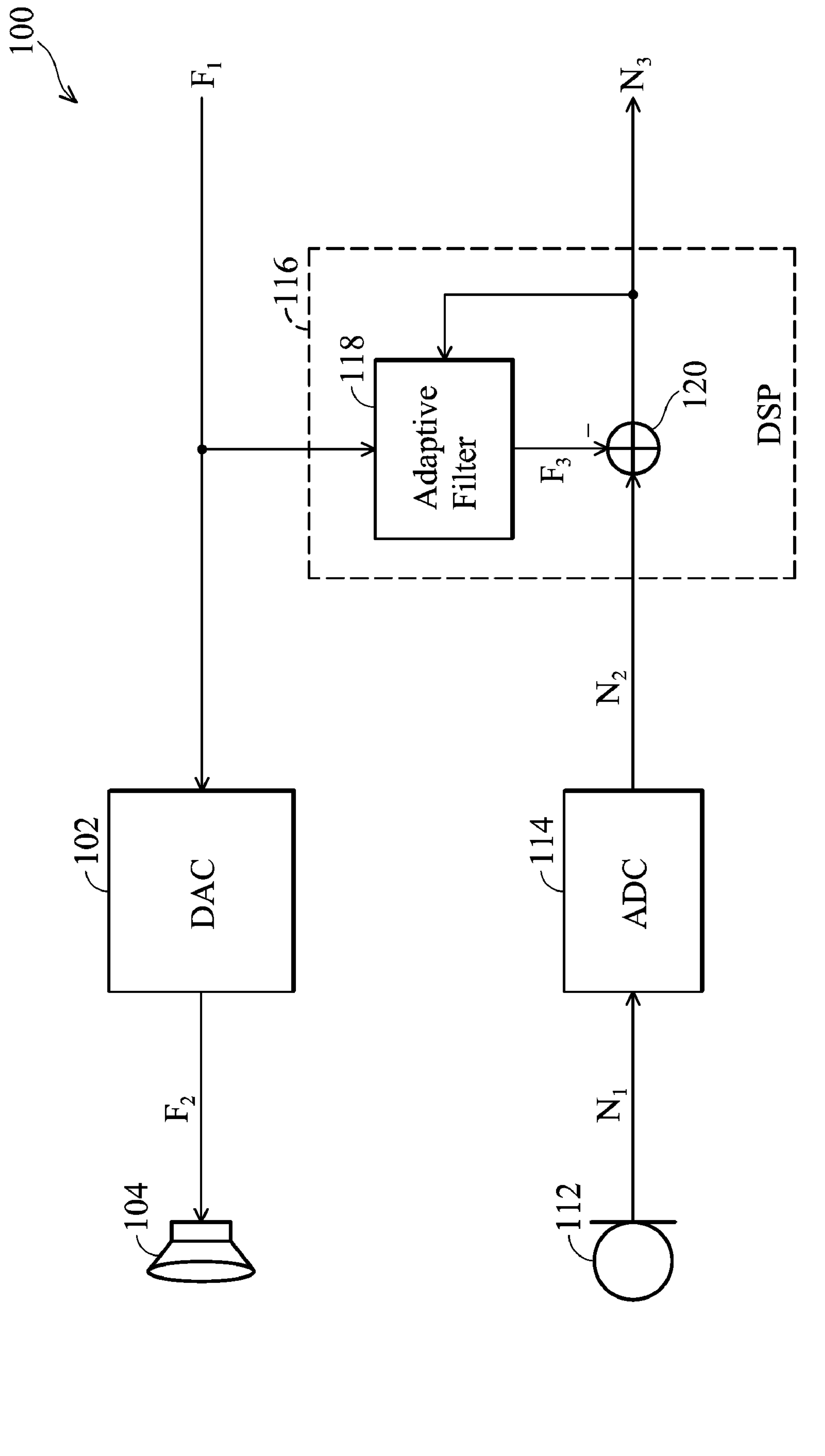
FIG. 1 ( PRIOR ART )
FIG. 1 is a block diagram of a portion of an audio processing device with full-duplex audio processing capability.
Figure 2:
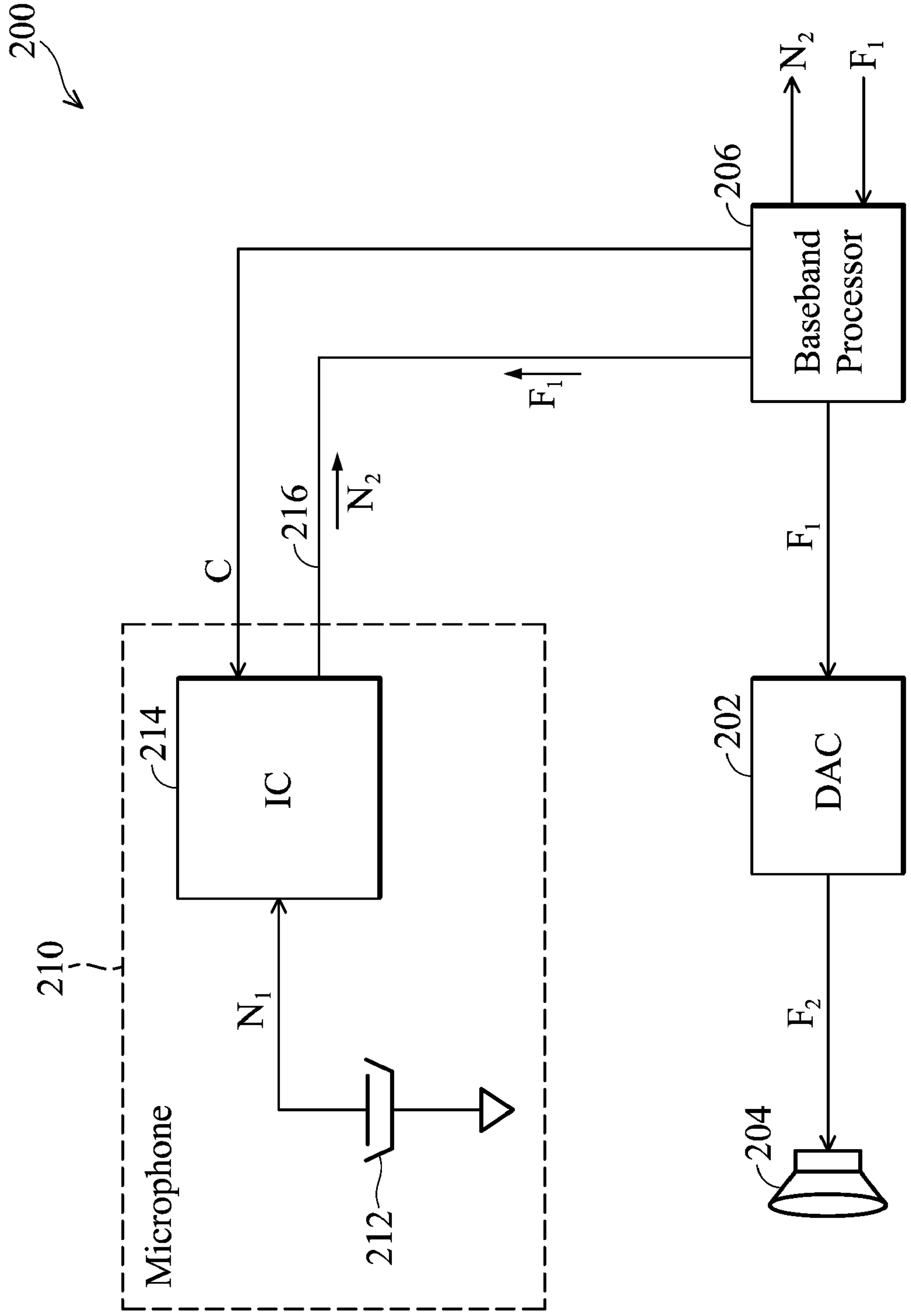
FIG. 2 is a block diagram of a portion of an audio processing device according to the invention.

Referring to FIG. 2, a block diagram of a portion of an audio processing device 200 according to the invention is shown. The audio processing device 200 comprises a microphone 210, a baseband processor 206, a digital-to-analog converter 202, and a speaker 204. The baseband processor 206 receives a far-end signal $F_1$ comprising far-end voices from a remote side and forwards the far-end signal $F_1$ to the digital-to-analog converter 202. Because the far-end signal $F_1$ has a digital format, the digital-to-analog converter 202 converts the far-end signal from digital to analog to obtain a far-end signal $F_2$. The speaker 204 then broadcasts the far-end signal $F_2$ at a near-end side, thus enabling a near-end user to hear the far-end voices.

The microphone 210 comprises a microphone cartridge 212 and an integrated circuit 214. The microphone cartridge 212 converts a sound comprising near-end voices to a near-end signal $N_1$. When the speaker 204 broadcasts the far-end signal $F_2$, the microphone cartridge 212 converts a portion of the far-end voices broadcasted by the speaker 212 into an echo component of the near-end signal $N_1$. To upgrade a sound quality of the near-end signal $N_1$, the echo component must be removed from the near-end signal $N_1$, leaving near-end voice components in the near-end signal. The integrated circuit 214 of the microphone 210 then cancels echo components from the near-end signal $N_1$ according to a far-end signal $F_1$ provided by the baseband processor 206 to obtain a near-end signal $N_2$ without echo components. The microphone 210 then outputs the near-end signal $N_2$ to the baseband processor 206. The baseband processor 206 then forwards the near-end signal $N_2$ to the remote side, thus enabling a far-end user to hear near-end voices carried by the near-end signal $N_2$.

Figure 3A:
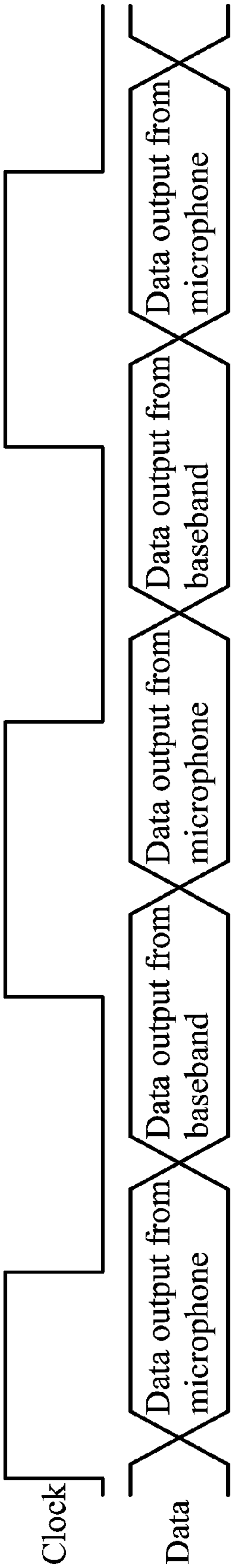
FIG. 3A is a schematic diagram of an embodiment of data transmission via a data line according to the invention.

A data line 216 is coupled between the integrated circuit 214 and the baseband processor 206. The integrated circuit 214 transmits the near-end signal $N_2$ to the baseband processor 206 via the data line 216. In addition, the integrated circuit 214 receives the far-end signal $F_1$ from the baseband processor 206 via the data line 216. In other words, transmission of both the near-end signal $N_2$ and the far-end signal $F_1$ are via the single data line 216. Referring to FIG. 3A, a schematic diagram of an embodiment of data transmission via the data line 216 according to the invention is shown. The baseband processor 206 provides the integrated circuit 214 with a clock signal C. When the clock signal C falls from a high level to a low level, the integrated circuit 214 outputs the near-end signal $N_2$ to the data line 216, and the baseband processor 206 receives the near-end signal $N_2$ from the data line 216. When the clock signal C raises from a low level to a high level, the baseband processor 206 outputs the far-end signal $F_1$ to the data line 216, and the integrated circuit 214 receives the far-end signal $F_1$ from the data line 216.

Figure 3B:
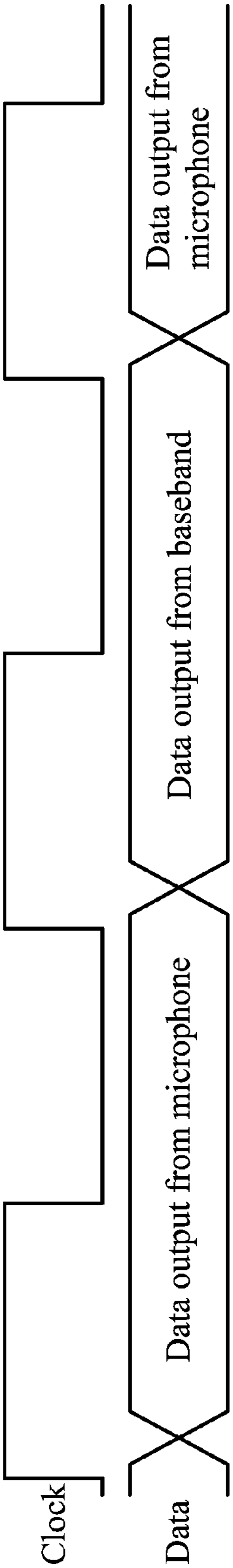
FIG. 3B is a schematic diagram of another embodiment of data transmission via a data line according to the invention.

Referring to FIG. 3B, a schematic diagram of another embodiment of data transmission via the data line 216 according to the invention is shown. When the clock signal C rises from a low level to a high level, data of the near-end signal $N_2$ or the far-end signal $F_1$ is output to the data line 216. When the clock signal C falls from a high level to a low level, data of the near-end signal $N_2$ or the far-end signal $F_1$ is read from the data line 216. In addition, the integrated circuit 214 and the baseband processor 206 alternately outputs the near-end signal $N_2$ and the far-end signal $F_1$ to the data line 216. For example, the integrated circuit 214 outputs the near-end signal $N_2$ to the data line 216 at a rising edge of a prior cycle of the clock signal C, and reads the far-end signal $F_1$ from the data line 216 at a falling edge of a subsequent cycle of the clock signal C. Contrarily, the baseband processor 206 reads the near-end signal $N_2$ from the data line 216 at a falling edge of the prior cycle of the clock signal C, and outputs the far-end signal $F_1$ to the data line 216 at a rising edge of the subsequent cycle of the clock signal C.

Figure 4:
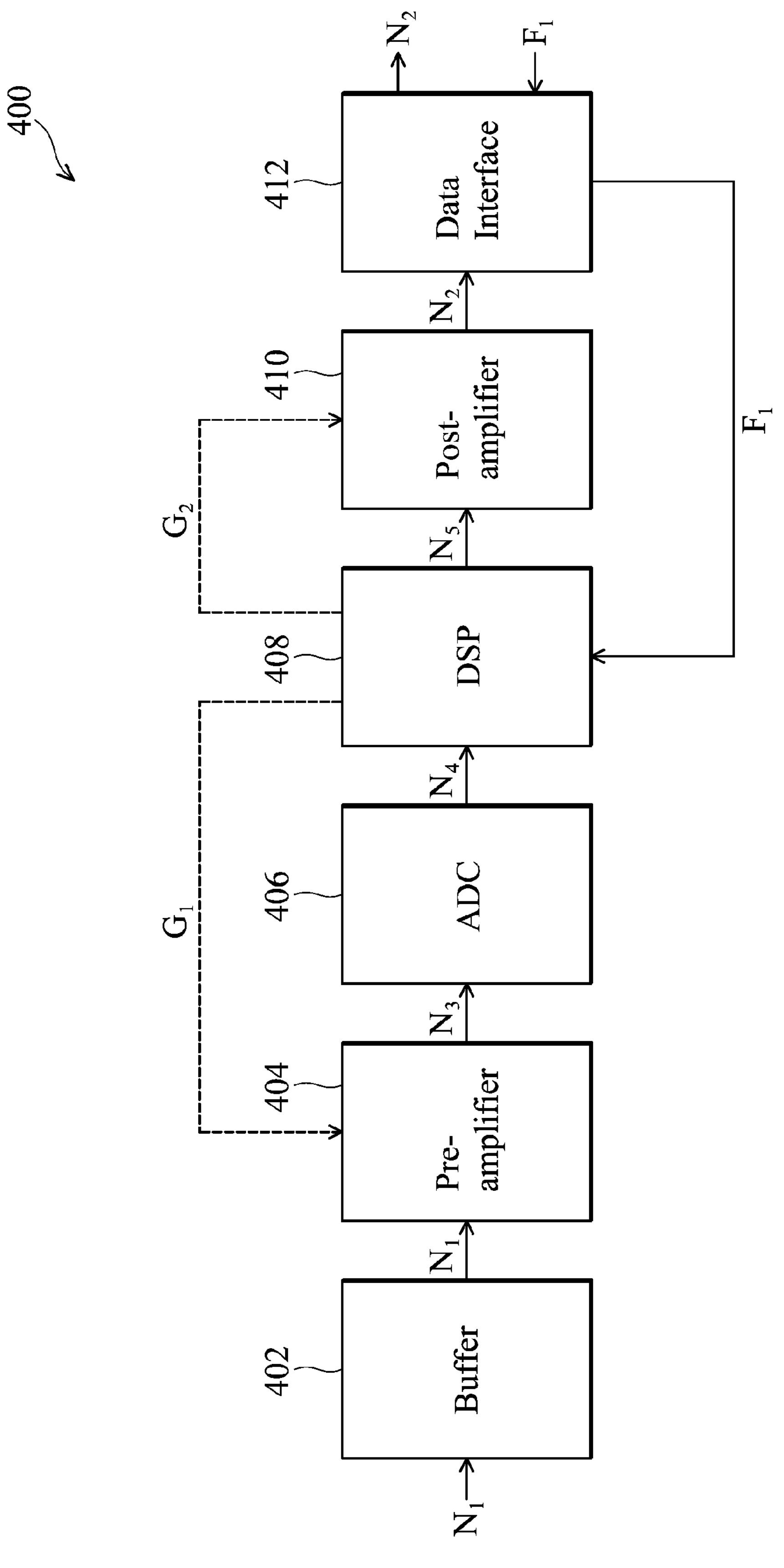
FIG. 4 is a block diagram of an integrated circuit according to the invention.

Referring to FIG. 4, a block diagram of an integrated circuit 400 according to the invention is shown. The integrated circuit 400 comprises a buffer 420, a pre-amplifier 404, an analog-to-digital converter 406, a digital signal processor 408, a post-amplifier 410, and a data interface 412. The buffer 402 holds data of the near-end signal $N_1$ output by the microphone cartridge 212. The data interface 412 outputs the near-end signal $N_2$ to the data line 216 and receives the far-end signal $F_1$ from the data line 216 according to the embodiments of FIGS. 3A and 3B. The digital signal processor 408 determines a pre-amplifier gain $G_1$ and a post-amplifier gain $G_2$, wherein a product of the gains $G_1$ and $G_2$ are kept constant. The pre-amplifier 404 then amplifies the near-end signal $N_1$ according to the gain $G_1$ to obtain an amplified near-end signal $N_3$. Thus, when the near-end signal $N_1$ carries near-end voices with a low amplitude, the near-end signal $N_1$ is properly amplified to increase a signal-to-noise ratio of the amplified near-end signal $N_3$.

In addition, the digital signal processor 408 determines the gain $G_1$ is determined in such a way that an amplitude of the amplified near-end signal $N_3$ is kept equal to an amplitude of the far-end signal $F_1$. Because the far-end signal $F_1$ is a digital signal with a limited amplitude which cannot exceed a threshold, the amplified near-end signal $N_3$ therefore also has a limited amplitude, preventing the subsequent analog-to-digital converter 406 from saturation. The analog-to-digital converter 406 then converts the amplified near-end signal $N_3$ from analog-to-digital to obtain a near-end signal $N_4$. The digital signal processor 408 then cancels echo components from the near-end signal $N_4$ according to the far-end signal $F_1$ to obtain a near-end signal $N_5$ without echoes. The post-amplifier 410 then amplifies the near-end signal $N_5$ according to the post-amplifier gain $G_2$ to obtain a near-end signal $N_2$. Finally, the data interface 412 outputs the near-end signal $N_2$ to the baseband processor 206 via the data line 216.

Because the near-end signal $N_2$ is properly amplified and the analog-to-digital converter 406 is prevented from saturation, the near-end signal $N_2$ has a higher sound quality than that of the conventional audio processing device 100. In addition, because both the digital signal processor 408 and the analog-to-digital converter 406 are integrated into the integrated circuit 214, the integrated circuit 214 occupies a reduced area on a printed circuit board of the audio processing device 200, and the audio processing device 200 has a smaller size than the conventional audio processing device 100.

Figure 5:
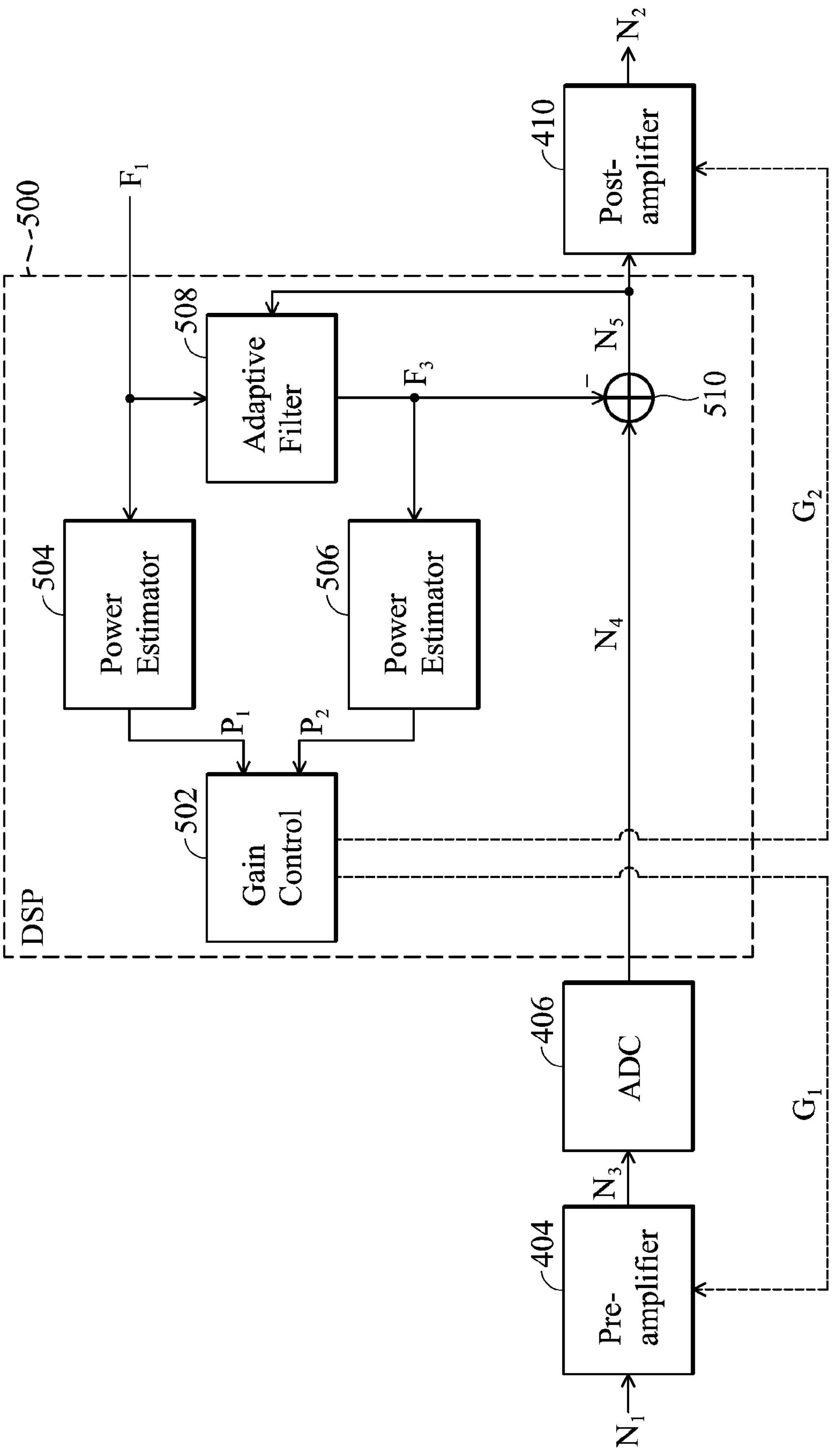
FIG. 5 is a block diagram of a digital signal processor according to the invention.

Referring to FIG. 5, a block diagram of a digital signal processor 500 according to the invention is shown. The digital signal processor 500 comprises a gain controller 502, power estimators 504 and 506, an adaptive filter 508, and a subtractor 510. The adaptive filter 508 first determines a filter coefficient set according to the feedback near-end signal $N_5$. The adaptive filter 508 then filters the far-end signal $F_1$ according to the filter coefficient set to obtain a filtered far-end signal $F_3$. In one embodiment, the adaptive filter 508 determines a filter coefficient set according to the following algorithm:

$$\vec{W}(n+1)=\vec{W}(n)+\mu\cdot V(n)\cdot\vec{X}(n);\text{ and}$$

$$\vec{X}(n)=[V(n),V(n-1),\ldots,V(n-N)],$$

wherein n is a sample index, W is the filter coefficient set, V is the near-end signal $N_5$, and μ is a predetermined value.

The power estimator 504 then calculates a power $P_1$ of the far-end signal $F_1$. Similarly, the power estimator 504 calculates a power $P_2$ of the filtered far-end signal $F_3$. In one embodiment, the power estimator 504 calculates the power $P_1$ of the far-end signal $F_1$ according to the following algorithm:

$$P_1(n+1)=\alpha_1\cdot P_1(n)+(1-\alpha_1)\cdot Q_1(n),$$

wherein n is a sample index, $P_1$ is a calculated power of the far-end signal $F_1$, $\alpha_1$ is a predetermined value, and $Q_1$ is a current power of the far-end signal $F_1$. In addition, the power estimator 506 calculates the power $P_2$ of the filtered far-end signal $F_3$ according to the following algorithm:

$$P_2(n+1)=\alpha_2 \cdot P_2(n)+(1-\alpha_2)\cdot Q_2(n),$$

wherein n is a sample index, $P_2$ is a calculated power of the far-end signal $F_1$, $\alpha_2$ is a predetermined value, and $Q_2$ is a current power of the far-end signal $F_2$.

The gain controller 502 then determines the gains $G_1$ and $G_2$ of the pre-amplifier 404 and the post-amplifier 410 according to comparison of the powers $P_1$ and $P_2$. When the power $P_1$ of the far-end signal $F_1$ is greater than the power $P_2$ of the filtered far-end signal $F_3$, the gain controller 502 increases the pre-amplifier gain $G_1$ and decreases the post-amplifier gain $G_2$. In addition, the gain controller 502 also increases the filter coefficient set of the adaptive filter 508. In one embodiment, the gain controller 502 determines the pre-amplifier gain $G_1$ and the post amplifier gain $G_2$ according to the following algorithm when the power $P_1$ of the far-end signal $F_1$ is greater than the power $P_2$ of the filtered far-end signal $F_3$:

$$G_1(n+1)=G_1(n)\cdot\Delta G,$$

$$G_2(n+1)=G_2(n)/\Delta G, \text{ and}$$

$$\vec{W}(n+1)=\vec{W}(n)\cdot\Delta G,$$

wherein n is a sample index, $G_1$ is the pre-amplifier gain, $G_2$ is the post-amplifier gain, W is the filter coefficient set, and $\Delta G$ is a minimum gain step size.

When the power $P_1$ of the far-end signal $F_1$ is less than the power $P_2$ of the filtered far-end signal $F_3$, the gain controller 502 decreases the pre-amplifier gain $G_1$ and increases the post-amplifier gain $G_2$. In addition, the gain controller 502 also decreases the filter coefficient set of the adaptive filter 508. In one embodiment, the gain controller 502 determines the pre-amplifier gain $G_1$ and the post amplifier gain $G_2$ according to the following algorithm when the power $P_1$ of the far-end signal $F_1$ is less than the power $P_2$ of the filtered far-end signal $F_3$:

$$G_1(n+1)=G_1(n)/\Delta G;$$

$$G_2(n+1)=G_2(n)\cdot\Delta G; \text{ and}$$

$$\vec{W}(n+1)=\vec{W}(n)/\Delta G,$$

wherein n is a sample index, $G_1$ is the pre-amplifier gain, $G_2$ is the post-amplifier gain, W is the filter coefficient set, and $\Delta G$ is a minimum gain step size.

The reason for adjusting the pre-amplifier gain $G_1$ and the post-amplifier gain $G_2$ according to comparison of the powers $P_1$ and $P_2$ is as follows. The filtered far-end signal $F_3$ filtered by the adaptive filter 508 has an amplitude almost equal to that of the near-end signal $N_4$, and the near-end signals $N_3$ and $N_4$ have the same amplitude. The power $P_2$ of the filtered far-end signal $F_3$ is therefore almost equal to the power of the near-end signal $N_3$. When the power $P_1$ of the far-end signal $F_1$ is greater than the power $P_2$ of the filtered far-end signal $F_3$, the power $P_1$ of the far-end signal $F_1$ is also greater than the power of the near-end signal $N_3$. The gain controller 502 therefore increases the pre-amplifier gain $G_1$, thus increasing the amplitude of the near-end signal $N_3$. When the power $P_1$ of the far-end signal $F_1$ is less than the power $P_2$ of the filtered far-end signal $F_3$, the power $P_1$ of the far-end signal $F_1$ is also less than the power of the near-end signal $N_3$. The gain controller 502 therefore decreases the pre-amplifier gain $G_1$, thus decreasing the amplitude of the near-end signal $N_3$. Thus, the amplitude of the amplified near-end signal $N_3$ is kept equal to that of the far-end signal $F_1$ to prevent the analog-to-digital converter 406 from saturation.

Figure 6:
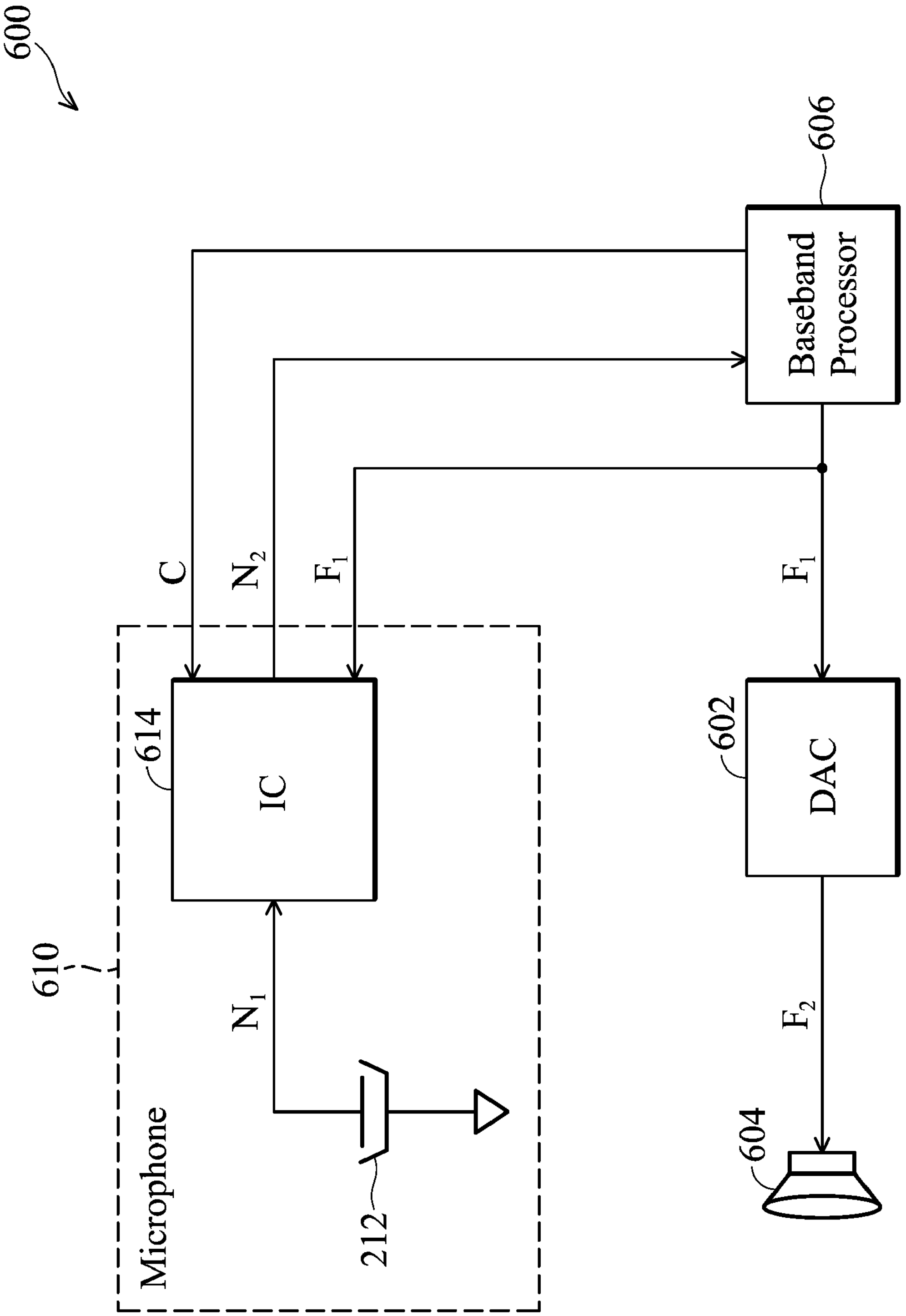
FIG. 6 is a block diagram of another embodiment of an audio processing device according to the invention.

Referring to FIG. 6, a block diagram of another embodiment of an audio processing device 600 according to the invention is shown. The audio processing device 600 is similar to the audio processing device 200 of FIG. 2 except for connection between the integrated circuit 614 and the baseband processor 606. Two data lines are coupled between the integrated circuit 614 and the baseband processor 606 for respectively transmitting the near-end signal $N_2$ and the far-end signal $F_1$ in opposite directions.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A microphone, comprising:

a microphone cartridge, receiving a sound and converting the sound to a first signal;

an integrated circuit, coupled to the microphone cartridge, receiving a reference signal from a baseband processor, canceling an echo component from the first signal according to the reference signal to obtain a second signal, and outputting the second signal to the baseband processor, wherein the reference signal has a digital format and is sent from a remote side;

wherein a data line is coupled between the integrated circuit and the baseband processor, and the integrated circuit receives the reference signal and outputs the second signal via a data line.

2. The microphone as claimed in claim 1, wherein the integrated circuit comprises:

a pre-amplifier, amplifying the first signal according to a first gain to obtain a third signal;

an analog-to-digital converter, converting the third signal from analog to digital to obtain a fourth signal;

a digital signal processor, canceling an echo component from the fourth signal according to the reference signal to obtain a fifth signal, and determining the first gain and a second gain, wherein a product of the first gain and the second gain is kept constant, and the first gain is determined so that an amplitude of the third signal is kept equal to an amplitude of the reference signal; and a post-amplifier, amplifying the fifth signal according to the second gain to obtain the second signal.

3. The microphone as claimed in claim 1, wherein the baseband processor provides the integrated circuit with a clock signal, and the integrated circuit comprises a data interface, outputting the second signal to the data line at a falling edge of the clock signal, and receiving the reference signal from the data line at a rising edge of the clock signal.

4. The microphone as claimed in claim 1, wherein the baseband processor provides the integrated circuit with a clock signal, and the integrated circuit comprises a data interface, outputting the second signal to the data line at a prior cycle of the clock signal, and reading the reference signal from the data line at a subsequent cycle of the clock signal.

5. The microphone as claimed in claim 2, wherein the digital signal processor comprises:

an adaptive filter, determining a filter coefficient set according to the fifth signal, and filtering the reference signal according to the filter coefficient set to obtain a filtered reference signal;

a first power estimator, calculating a first power of the reference signal;

a second power estimator, calculating a second power of the filtered reference signal;

a gain controller, increasing the first gain when the first power is greater than the second power, and decreasing the first gain when the first power is less than the second power; and a subtractor, subtracting the filtered reference signal from the fourth signal to obtain the fifth signal.

6. The microphone as claimed in claim 5, wherein the adaptive filter determines the filter coefficient set according to the following algorithm:

$$\vec{W}(n+1)=\vec{W}(n)+\mu\cdot V(n)\cdot\vec{X}(n);\text{ and}$$

$$\vec{X}(n)=[V(n),V(n-1),\ldots,V(n-N)],$$

wherein n is a sample index, W is the filter coefficient set, V is the fifth signal, and μ is a predetermined value.

7. The microphone as claimed in claim 5, wherein the first power estimator calculates the first power according to the following algorithm:

$$P_1(n+1)=\alpha_1\cdot P_1(n)+(1-\alpha_1)\cdot Q_1(n),$$

wherein n is a sample index, $P_1$ is the first power, $\alpha_1$ is a predetermined value, and $Q_1$ is a current power of the reference signal; and the second power estimator calculates the second power according to the following algorithm:

$$P_2(n+1)=\alpha_2\cdot P_2(n)+(1-\alpha_2)\cdot Q_2(n),$$

wherein n is a sample index, $P_2$ is the second power, $\alpha_2$ is a predetermined value, and $Q_2$ is a current power of the filtered reference signal.

8. The microphone as claimed in claim 5, wherein the gain controller adjusts the first gain and the second gain according to the following algorithm when the first power is greater than the second power:

$$G_1(n+1)=G_1(n)\cdot\Delta G;\text{ and}$$

$$G_2(n+1)=G_2(n)/\Delta G,$$

wherein n is a sample index, $G_1$ is the first gain, $G_2$ is the second gain, and ΔG is a minimum gain step size; and the gain controller adjusts the first gain and the second gain according to the following algorithm when the first power is less than the second power:

$$G_1(n+1)=G_1(n)/\Delta G;\text{ and}$$

$$G_2(n+1)=G_2(n)\cdot\Delta G,$$

wherein n is a sample index, $G_1$ is the first gain, $G_2$ is the second gain, and ΔG is the minimum gain step size.

9. The microphone as claimed in claim 8, wherein the gain controller adjusts the filter coefficient set according to the following algorithm when the first power is greater than the second power:

$$\vec{W}(n+1)=\vec{W}(n)\cdot\Delta G,$$

wherein n is a sample index, W is the filter coefficient set, and ΔG is the minimum gain step size; and the gain controller adjusts the filter coefficient set according to the following algorithm when the first power is less than the second power:

$$\vec{W}(n+1)=\vec{W}(n)/\Delta G,$$

wherein n is a sample index, W is the filter coefficient set, $G_2$ is the second gain, and ΔG is the minimum gain step size.

10. The microphone as claimed in claim 5, wherein the gain controller increases the filter coefficient set when the first power is greater than the second power, and decreases the filter coefficient set when the first power is less than the second power.

11. An integrated circuit of a microphone, wherein the integrated circuit receives a first signal converted from a sound and receives a reference signal with a digital format for echo cancellation, comprising:

a pre-amplifier, amplifying the first signal according to a first gain to obtain a third signal;

an analog-to-digital converter, converting the third signal from analog to digital to obtain a fourth signal;

a digital signal processor, canceling an echo component from the fourth signal according to the reference signal to obtain a fifth signal, and determining the first gain and a second gain, wherein a product of the first gain and the second gain is kept constant, and the first gain is determined so that an amplitude of the third signal is kept equal to an amplitude of the reference signal; and a post-amplifier, amplifying the fifth signal according to the second gain to obtain a second signal as an output of the integrated circuit.

12. The integrated circuit as claimed in claim 11, wherein the digital signal processor comprises:

an adaptive filter, determining a filter coefficient set according to the fifth signal, and filtering the reference signal according to the filter coefficient set to obtain a filtered reference signal;

a first power estimator, calculating a first power of the reference signal;

a second power estimator, calculating a second power of the filtered reference signal;

a gain controller, increasing the first gain when the first power is greater than the second power, and decreasing the first gain when the first power is less than the second power; and a subtractor, subtracting the filtered reference signal from the fourth signal to obtain the fifth signal.

13. The integrated circuit as claimed in claim 12, wherein the adaptive filter determines the filter coefficient set according to the following algorithm:

$$\vec{W}(n+1)=\vec{W}(n)+\mu\cdot V(n)\cdot\vec{X}(n);\text{ and}$$

$$\vec{X}(n)=[V(n),V(n-1),\ldots,V(n-N)],$$

wherein n is a sample index, W is the filter coefficient set, V is the fifth signal, and μ is a predetermined value.

14. The integrated circuit as claimed in claim 12, wherein the first power estimator calculates the first power according to the following algorithm:

$$P_1(n+1)=\alpha_1\cdot P_1(n)+(1-\alpha_1)\cdot Q_1(n),$$

wherein n is a sample index, $P_1$ is the first power, $\alpha_1$ is a predetermined value, and $Q_1$ is a current power of the reference signal; and the second power estimator calculates the second power according to the following algorithm:

$$P_2(n+1)=\alpha_2 \cdot P_2(n)+(1-\alpha_2)\cdot Q_2(n),$$

wherein n is a sample index, $P_2$ is the second power, $\alpha_2$ is a predetermined value, and $Q_2$ is a current power of the filtered reference signal.

15. The integrated circuit as claimed in claim 12, wherein the gain controller adjusts the first gain and the second gain according to the following algorithm when the first power is greater than the second power:

$$G_1(n+1)=G_1(n)\cdot\Delta G; \text{ and}$$

$$G_2(n+1)=G_2(n)/\Delta G,$$

wherein n is a sample index, $G_1$ is the first gain, $G_2$ is the second gain, and ΔG is a minimum gain step size; and the gain controller adjusts the first gain and the second gain according to the following algorithm when the first power is less than the second power:

$$G_1(n+1)=G_1(n)/\Delta G; \text{ and}$$

$$G_2(n+1)=G_2(n)\cdot\Delta G,$$

wherein n is a sample index, $G_1$ is the first gain, $G_2$ is the second gain, and ΔG is the minimum gain step size.

16. The integrated circuit as claimed in claim 15, wherein the gain controller adjusts the filter coefficient set according to the following algorithm when the first power is greater than the second power:

$$\vec{W}(n+1)=\vec{W}(n)\cdot\Delta G,$$

wherein n is a sample index, W is the filter coefficient set, and ΔG is the minimum gain step size; and the gain controller adjusts the filter coefficient set according to the following algorithm when the first power is less than the second power:

$$\vec{W}(n+1)=\vec{W}(n)/\Delta G,$$

wherein n is a sample index, W is the filter coefficient set, $G_2$ is the second gain, and ΔG is the minimum gain step size.

17. The integrated circuit as claimed in claim 12, wherein the gain controller increases the filter coefficient set when the first power is greater than the second power, and decreases the filter coefficient set when the first power is less than the second power.

18. The integrated circuit as claimed in claim 12, wherein a data line is coupled between the integrated circuit and a baseband processor, the baseband processor provides the integrated circuit with a clock signal and the reference signal via the data line and receives the second signal from the integrated circuit via the data line.

19. The integrated circuit as claimed in claim 18, wherein the integrated circuit comprises a data interface, outputting the second signal to the data line at a falling edge of the clock signal, and receiving the reference signal from the data line at a rising edge of the clock signal.

20. The integrated circuit as claimed in claim 18, wherein the integrated circuit comprises a data interface, outputting the second signal to the data line at a prior cycle of the clock signal, and reading the reference signal from the data line at a subsequent cycle of the clock signal.

* * * * *